United States Patent
Yamamoto

(10) Patent No.: US 7,525,602 B2
(45) Date of Patent: Apr. 28, 2009

(54) LIQUID CRYSTAL TELEVISION APPARATUS

(75) Inventor: Kazuhiko Yamamoto, Osaka (JP)

(73) Assignee: Funai Electric Co., Ltd., Daito-shi, Osaka (JP)

( * ) Notice: Subject to any disclaimer, the term of this patent is extended or adjusted under 35 U.S.C. 154(b) by 653 days.

(21) Appl. No.: 11/270,332

(22) Filed: Nov. 9, 2005

(65) Prior Publication Data
US 2006/0132661 A1    Jun. 22, 2006

(30) Foreign Application Priority Data
Nov. 9, 2004    (JP)    ............................ P2004-324916

(51) Int. Cl.
   H04N 5/50    (2006.01)
   H04N 3/14    (2006.01)
   H05K 1/18    (2006.01)
(52) U.S. Cl. .................. 348/725; 348/731; 348/790; 361/761
(58) Field of Classification Search ................ 348/725, 348/731, 790; 361/761
   See application file for complete search history.

(56) References Cited

U.S. PATENT DOCUMENTS

| | | | | |
|---|---|---|---|---|
| 7,030,940 B2 * | 4/2006 | Sasaki | ......................... | 348/731 |
| 7,046,310 B2 * | 5/2006 | Lee | ............................. | 348/836 |
| 7,129,994 B2 * | 10/2006 | Sasaki et al. | ................. | 348/731 |
| 7,262,819 B2 * | 8/2007 | Takahashi | ................... | 348/836 |
| 7,268,836 B2 * | 9/2007 | Yamamoto | ................... | 348/731 |
| 7,289,167 B2 * | 10/2007 | Yamamoto | ................... | 348/731 |
| 7,301,775 B2 * | 11/2007 | Isoda | ......................... | 361/728 |
| 2005/0007500 A1 * | 1/2005 | Lin et al. | .................... | 348/790 |
| 2005/0162242 A1 * | 7/2005 | Ootori et al. | ................. | 334/85 |
| 2007/0291180 A1 * | 12/2007 | Takatori | ..................... | 348/726 |

FOREIGN PATENT DOCUMENTS

JP    06-334543    12/1994
JP    2002-217765    8/2002

OTHER PUBLICATIONS

Patent Abstracts of Japan, Publication No. 06-334543, dated Dec. 2, 1994 (1 page).
Patent Abstracts of Japan, Publication No. 2002-217765, dated Aug. 2, 2002 (1 page).

* cited by examiner

*Primary Examiner*—Brian P Yenke
(74) *Attorney, Agent, or Firm*—Osha • Liang LLP

(57) ABSTRACT

A liquid crystal television apparatus includes a tuner, a signal processor, a liquid crystal cell, a light source for backlight, an inverter, and a power supply, includes a first circuit board including a single-sided board, a second circuit board including a multilayered board, and a connector that electrically connects the first and second circuit boards. An area of the second circuit board is smaller than the first circuit board. The signal processor is mounted on the second circuit board. On the first circuit board, the tuner is arranged in a lower portion of a left or right side of the first circuit board, the inverter is arranged in an upper portion of an opposite side of the first circuit board to the tuner, the power supply is arranged in a lower portion in the opposite side, and the connector is arranged in an upper portion of the same side.

5 Claims, 3 Drawing Sheets ded in JP-A-6-334543 (paragraph
LIQUID CRYSTAL TELEVISION APPARATUS

BACKGROUND OF THE INVENTION

1. Field of the Invention

The present invention relates to a liquid crystal television apparatus, and more specifically, to arrangement of circuits on a board.

2. Description of the Related Art

Recently, a liquid crystal television apparatus employing an LCD (liquid crystal display) as a display (hereinafter abbreviated as liquid crystal television) have widely spread. The liquid crystal television has an advantage of thinness, light-weight and low power consumption as compared with a conventional television employing a CRT (cathode ray tube). Typically, the liquid crystal television contains a light source for backlight. In such a liquid crystal television, a color image is displayed on a screen of liquid crystal cells by irradiating light emitted from the light source on liquid crystal cells in front of the light source through a diffusion plate or a prism sheet and passing the light through color filters provided in the cells.

FIG. 3 shows an electric block diagram of a general liquid crystal television. Reference numeral 21 denotes an antenna for receiving broadcasting electromagnetic wave signals and reference numeral 22 denotes a tuner for extracting an image signal having a selected frequency from the signals received in the antenna 21. Reference numeral 23 denotes a signal processor for performing a digital processing for the image signal extracted by the tuner 22. The signal processor 23 includes one digital IC containing a CPU, a video decoder for decoding the image signal, a timing controller for controlling display of images, etc.

Reference numeral 24 denotes known liquid crystal cells in which images are displayed on the basis of outputs from the signal processor 23. Source drivers 31 to 35 and gate drivers 36 and 37 are attached to the liquid crystal cells 24. Each of the source drivers 31 to 35 is a circuit for driving pixels (R, G, B) in an X direction (horizontal direction) of the liquid crystal cells 24 and each of the gate drivers 36 and 37 is a circuit for driving pixels in a Y direction (vertical direction) of the liquid crystal cells 24. Each of these drivers includes one IC and is supplied with output signals from the signal processor 23. In addition, the ICs forming the gate drivers 36 and 37 are mounted on a glass substrate of the liquid crystal cells 24, and also, wires carrying the output signals from the signal processor 23 are provided on the glass substrate.

Reference numeral 25 denotes a backlight unit arranged at a back side of the liquid crystal cells 24. The backlight unit 25 includes light sources 26a and 26b for backlight for irradiating the liquid crystal cells 24. The light sources 26a and 26b for backlight are cold cathode tube, for example. Reference numeral 27 denotes a power supply for supplying voltages required for various components based on a voltage of AC 100V obtained through a power plug 28. Reference numeral 29 denotes an inverter for supplying a voltage required to drive the light sources 26a and 26b for backlight to the backlight unit 25.

In FIG. 3, blocks of components related to voice are not shown for the purpose of brevity. Also, a microcomputer, a memory and the other components forming a controller are not shown for the purpose of brevity.

In the above-configured liquid crystal television, the tuner 22, the signal processor 23, the power supply 27, and the inverter 29 are mounted on a circuit board contained in a body of the television. A television circuit board on which a tuner, a signal processor, a power supply and the other components are mounted, is disclosed in JP-A-6-334543 (paragraph [0024] to [0028], and FIG. 2). Also, arrangement of connection lands at a portion in which the tuner on the circuit board is mounted, is disclosed in JP-A-2002-217765 (paragraph [0012] to [0028]).

Since a digital signal process is performed in a liquid crystal television, various circuit components for the digital signal process are needed and a multilayered board is requisite to improve efficiency of board packaging. Accordingly, a multilayered board, for example, a four-layered board, on which the tuner, the signal processor, the power supply, the inverter and the other components are integrally mounted, has been conventionally used as the circuit board of the liquid crystal television. However, such a multilayered board is expensive, which is a great obstacle to cost-down of the liquid crystal television. On the other hand, when a single-sided board is used instead of the multilayered board in the liquid crystal television, a great mounting area is needed, which may allows the board impossible to be contained in the liquid crystal television since there exist many circuit components in the liquid crystal television, as mentioned above, although the single-sided board is less expensive than the multilayered board.

In addition, since the single-sided board has low flexibility for a wiring pattern such as a power line or a ground line, as compared to the multilayered board, there arises a problem in that circuits on the board are susceptible to noises depending on arrangement of the circuits on the board and characteristics of the circuits are deteriorated. For example, when the tuner is arranged adjacent to the power supply as disclosed in JP-A-6-334543, noises generated in the power supply overlaps with a signal from the tuner and are transmitted to the signal processor, which results in deterioration of image quality due to noises appearing on a screen of the television.

SUMMARY OF THE INVENTION

The present invention provides a liquid crystal television which is inexpensive and has few noises.

The present invention provides a liquid crystal television apparatus including a tuner for extracting an image signal having a predetermined frequency from signals received in an antenna, a signal processor for performing a digital processing for the image signal extracted by the tuner, liquid crystal cells for displaying images on the basis of outputs from the signal processor, a light source for backlight arranged at a back side of the liquid crystal cells for irradiating the cells, an inverter for driving the light source for backlight, and a power supply for supplying power to various components, further including a first circuit board formed of a single-sided board, and a second circuit board formed of a multilayered board. The first circuit board is electrically connected to the second circuit board, and area of the second circuit board is smaller than area of the first circuit board. The tuner, the inverter and the power supply are mounted on the first circuit board, and the signal processor is mounted on the second circuit board. In addition, on the first circuit board, the tuner is arranged at a corner in the left or right portion of the first circuit board and the inverter is arranged at a corner in a diagonal direction from the corner in the left or right portion of the first circuit board.

With the above configuration, by using the single-sided board and the multilayered board as the circuit board, mounting the signal processor 23 for performing various digital signal processes for circuit components on the multilayered board, and mounting the tuner, the inverter and the power supply on the single-sided board, since the multilayered board can be small-sized as it mounts only the signal processor, cost-down of the liquid crystal television can be achieved. On the other hand, since the signal processor is not mounted on the single-sided board, the mounting area of the board does not need to be excessively wide. Accordingly, the single-sided board can be contained in a small-sized liquid crystal television. In addition, according to a result of studies of arrangement of circuits on the single-sided board, since the tuner and the inverter are arranged at corners opposite to each other in a diagonal direction, a distance between the tuner and the inverter is secured at a maximum. Accordingly, noises, which may be generated by the inverter, have little effect on signals from the tuner, and accordingly, it can be prevented that image quality is deteriorated due to overlap of the noises with image signals.

In a preferred embodiment of the present invention, on the first circuit board, the tuner is arranged in the left or right and lower portion of the first circuit board, the inverter is arranged in the upper portion of the first circuit board, which is opposite to the tuner. In addition, the power supply is arranged in the lower portion of the first circuit board, which is opposite to the tuner. In addition, a connector for connecting the first circuit board and the second circuit board is arranged in the same upper portion of the first circuit board as the tuner. With this configuration, by arranging the power supply in the lower portion of the first circuit board, the board can be stably adhered to the liquid crystal television while a cord from the power supply can be easily drawn out downward. In addition, since the connector for connecting the first circuit board and the second circuit board can be isolated from the inverter or the power supply, noises become difficult to overlap with signals transmitted from the first circuit board to the second circuit board.

In a preferred embodiment of the present invention, the power supply includes an AC power circuit including a transformer, and the power is supplied from a secondary side of the transformer to the various components. With this configuration, different voltages can be simply taken out of the secondary side of the transformer, various voltages, for example, 30V for the tuner and 3.3V for the signal processor, can be applied to the various components without installing a separate circuit such as a DC/DC converter on the board. Accordingly, the number of circuit components can be reduced, which results in cost-down of the liquid crystal television and reduction of a mounting area of the first circuit board (the single-sided board).

In a preferred embodiment of the present invention, a vertical-arrangement typed tuner element used in a CRT television is used as the tuner element of the tuner. A tuner element used in a conventional liquid crystal television is expensive since it employs a shield-type containing an IF (intermediate frequency) amplifier, and has a great mounting area since it employs a horizontal-arrangement typed tuner element. On the contrary, the tuner of the present invention does not need the shield-typed tuner element containing the IF amplifier since the tuner becomes difficult to be affected by noises. Accordingly, by using an inexpensive vertical-arrangement typed tuner element used in the CRT television, cost-down of the liquid crystal television can be achieved. Moreover, since the tuner element is of a vertical-arrangement type requiring a less adherence area, the mounting area of the board can be even reduced.

According to the present invention, cost-down of the liquid crystal television can be achieved by using the single-sided board, and deterioration of image quality due to noises can be prevented since noises generated by the inverter have little effect on signals from the tuner.

DETAILED DESCRIPTION OF THE INVENTION

Figure 1:
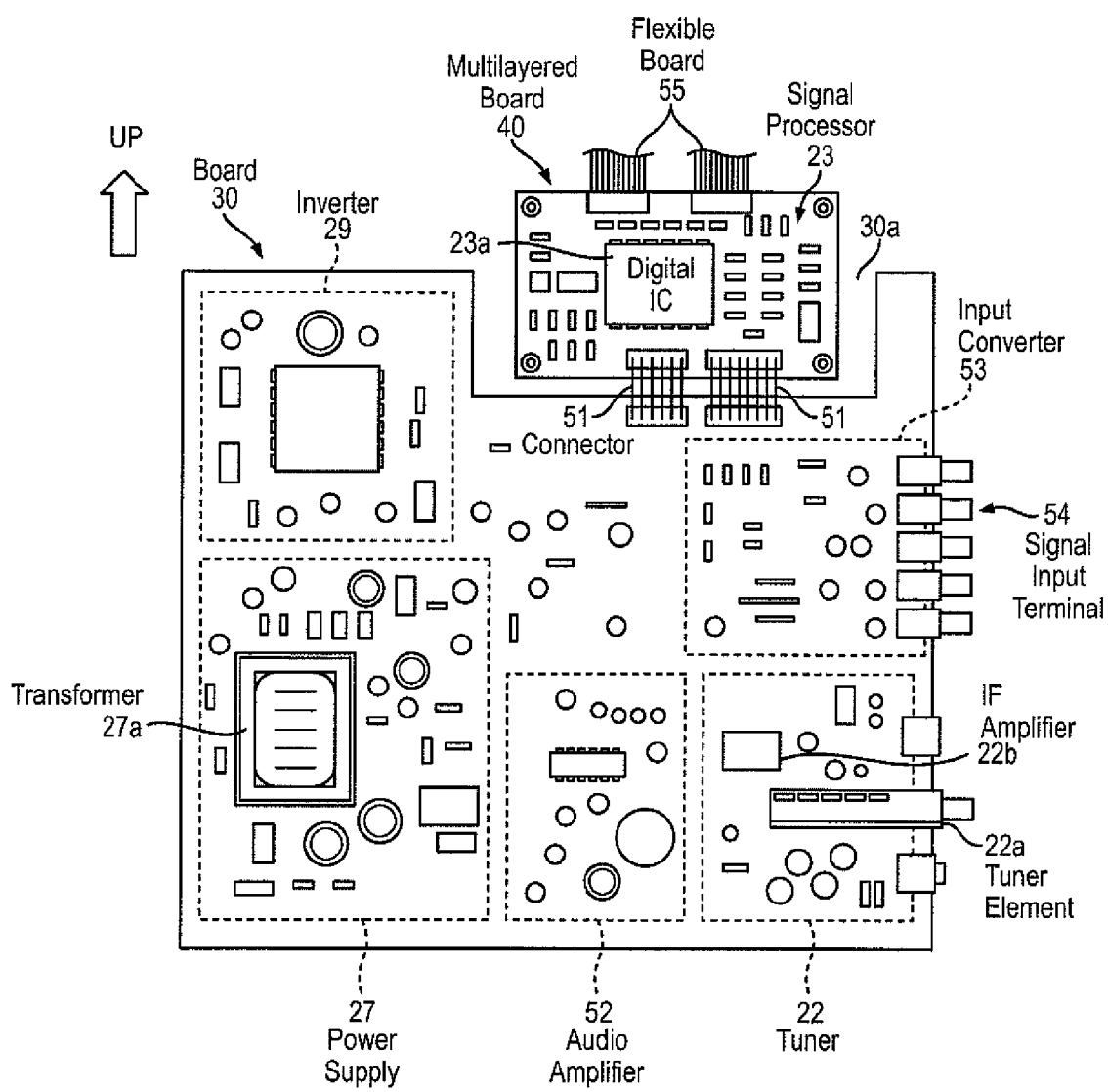
FIG. 1 is a front view of a circuit board of a liquid crystal television according to an embodiment of the present invention.
Figure 2:
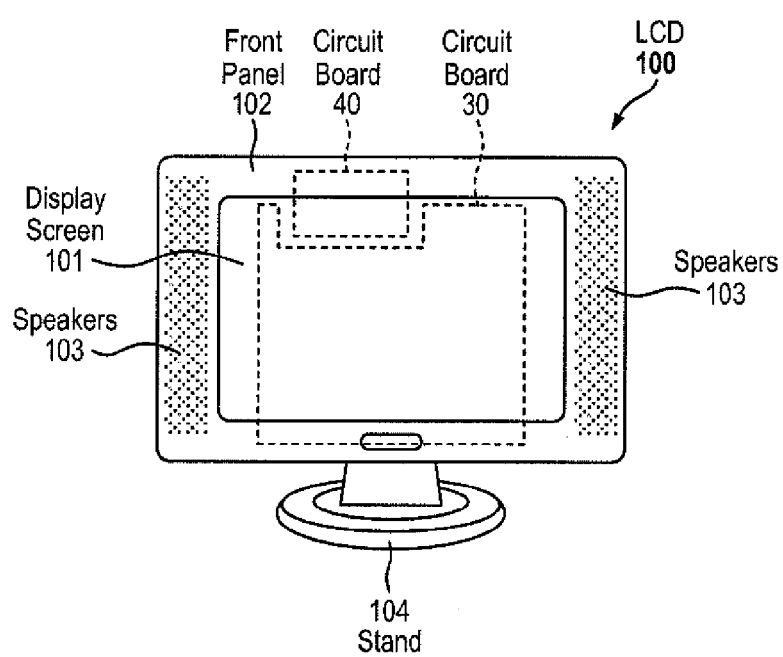
FIG. 2 is a front view of the liquid crystal television.

FIG. 1 is a front view of a circuit board of a liquid crystal television according to an embodiment of the present invention and FIG. 2 is a front view of the liquid crystal television. In addition, since the liquid crystal television of the present invention has the same circuits as that shown in FIG. 3, FIG. 3 is cited as an embodiment of the present invention.

Referring to FIG. 1, reference numeral 30 denotes a single-sided board on which wiring patterns are mounted, as a first circuit board in the present invention. Reference numeral 40 denotes a multilayered board on which wiring patterns are mounted, as a second circuit board in the present invention. The single-sided board 30 is electrically connected to the multilayered board 40 via a wire harness constituting a connector 51. The wire harness may be replaced with a flexible board or the like. A concave portion 30a is formed on the upper side of the single-sided board and a part of the multilayered board 40 is inserted in the concave portion.

Figure 3:
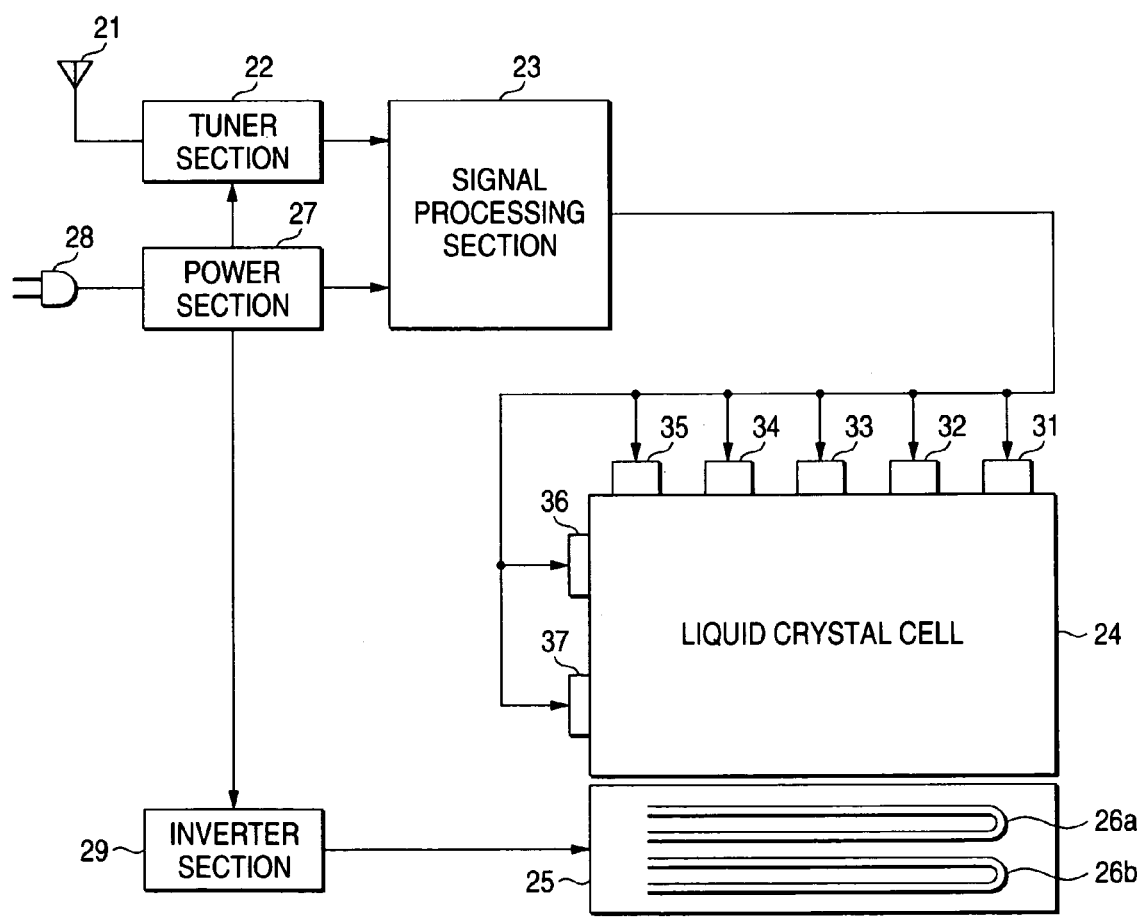
FIG. 3 is an electric block diagram of a general liquid crystal television.

Mounted on the single-sided board 30 as a main board are an audio amplifier 52, an input converter 53, etc., which are not shown in FIG. 3, in addition to the tuner 22, the inverter 29 and the power supply 27, which are shown in FIG. 3. Reference numeral 54 denotes a signal input terminal. The tuner 22 includes a tuner element 22a and an IF amplifier 22b. The tuner element 22a is a vertical-arrangement typed tuner element used in a CRT television and has an adherence height (in a vertical direction of a paper) of 23 mm, for example, when it is adhered to the single-sided board 30. The IF amplifier 22b is not contained in the tuner element 22a, but is mounted separately from the tuner element 22a. The power supply 27 has an AC power circuit including a transformer 27a. A voltage of AC 100V is applied to a primary side of the transformer 27a through the power plug 28 shown in FIG. 3. Further, a voltage of 30V for the tuner 22 and a voltage of 3.3V for the signal processor 23 are taken out of a secondary side of the transformer 27a and are applied to various components through power lines (not shown) formed on the board 30.

In the single-sided board 30, the tuner 22 is arranged at a corner in the right and lower portion of the board and the inverter 29 is arranged at a corner in the left and upper portion of the board, which lies in a diagonal direction from the corner in the right and lower portion of the board. As a result, the tuner 22 is opposite to the inverter 29 in the diagonal direction. In addition, the power supply 27 is arranged in the left and lower portion of the board, which is opposite to the tuner 22. In addition, the connector 51 is arranged in the right portion of the board, similarly to the tuner 22, but in the upper portion of the board.

On the other hand, the multilayered board 40 has area smaller than that of the single-sided board 30. The signal processor 23 is mounted on the multilayered board 40, as shown in FIG. 3. Reference numeral 23a denotes a digital IC containing the above-mentioned CPU, video decoder, and timing controller. Reference numeral 55 denotes a flexible board for delivering the output signals from the signal processor to the liquid crystal cells 24 (FIG. 3).

The above-configured circuit boards 30 and 40 are integrally formed, as shown by dashed lines in FIG. 2, in the back side of a liquid crystal television 100 shown in FIG. 2. In FIG. 2, reference numeral 101 denotes a display screen of the liquid crystal cells 24, reference numeral 102 denotes a front panel, reference numeral 103 denotes a pair of speakers contained in the left and right of the front panel 102, and reference numeral 104 denotes a stand for supporting a body of the liquid crystal television 100. The single-sided board 30 is integrally formed such that a side of the single-sided board 30 on which the circuit components are mounted is opposite to the display screen 101. Accordingly, the arrangement of the boards 30 and 40 in FIG. 2 is bilaterally symmetrical to the arrangement of the boards 30 and 40 in FIG. 1. In the liquid crystal television 100, images are displayed on the display screen 101 and voice is output from the speaker 103 by manipulating a remote controller (not shown).

As described in the above embodiment, the circuit board is formed of the single-sided board 30 and the multilayered board 40 having the area smaller than that of the single-sided board 30, the signal processor 23 for performing various digital signal processes for circuit components is mounted on the multilayered board 40, and the tuner 22, the inverter 29 and the power supply 27 are mounted on the single-sided board 30. Accordingly, since the multilayered board 40 can be small-sized as it mounts only the signal processor 23, cost-down of the liquid crystal television can be achieved. In addition, since the signal processor 23 is not mounted on the single-sided board 30, a mounting area is not excessively wide. Accordingly, the single-sided board 30 can be contained in a small-sized liquid crystal television.

In addition, by arranging the tuner 22, the inverter 29, the power supply 27, and the connector 51 as shown in FIG. 1, since the tuner 22 is isolated from the inverter 29 at a maximal distance on a diagonal line, noises, which may be produced when the inverter 29 performs a switching operation, have no effect on signals from the tuner 22, and accordingly, it can be prevented that image quality is deteriorated due to overlap of the noises with image signals. In addition, since the connector 51 can be also isolated from the inverter 29 or the power supply 27, noises become difficult to overlap with signals transmitted from the single-sided board 30 to the multilayered board. In addition, by arranging the power supply 27 including the transformer 27a in the lower portion of the single-sided board 30, the board 30 can be stably adhered to the liquid crystal television 100 while a cord (not shown) from the power supply 27 can be easily drawn out downward.

In addition, since different voltages can be simply taken out of the secondary side of the transformer 27a, there is no need to install a circuit such as a DC/DC converter on the single-sided board 30. Accordingly, the number of circuit components can be reduced, which results in cost-down of the liquid crystal television 100 and reduction of the mounting area of the single-sided board.

In addition, since an inexpensive vertical-arrangement typed tuner element used in the CRT television is used as the tuner element 22a of the tuner 22, cost-down of the liquid crystal television 100 can be achieved. Moreover, since the tuner element 22a is of a vertical-arrangement type requiring a less adherence area, the mounting area of the single-sided board 30 can be even reduced.

In addition to the above embodiment, the present invention may employ various different embodiments. For example, while the tuner 22 is arranged at the corner in the right and lower portion of the board 30 and the inverter 29 is arranged at the corner in the left and upper portion of the board 30 in the above embodiment, the tuner 22 may be arranged at a corner in the right and upper portion (a position of the input converter 53 in FIG. 1) of the board 30 and the inverter 29 may be arranged at a corner in the left and lower portion (a position of the power supply 27 in FIG. 1) of the board 30. In addition, the input converter 53 may be arranged at the corner in the right and lower portion (a position of the tuner 22 in FIG. 1) of the board 30 and the power supply 27 may be arranged at the corner in the left and upper portion (a position of the inverter 29 in FIG. 1) of the board 30. Furthermore, the inverter 29 and the power supply 27 may be arranged in the right portion of the board 30, and the tuner 22, the connector 51 and the input converter 53 may be arranged in the left portion of the board 30.

What is claimed is:

1. A liquid crystal television apparatus including a tuner for extracting an image signal having a predetermined frequency from signals received in an antenna, a signal processor for performing a digital processing for the image signal extracted by the tuner, a liquid crystal cell for displaying an image based on an output from the signal processor, a light source for backlight arranged on a back side of the liquid crystal cell for irradiating the cell, an inverter for driving the light source for backlight, and a power supply having an AC power circuit including a transformer for supplying power from a secondary side of the transformer to each portion, comprising:
    a first circuit board including a single-sided board;
    a second circuit board including a multilayered board; and
    a connector that electrically connects the first circuit board to the second circuit board,
    wherein an area of the second circuit board is smaller than an area of the first circuit board,
    the tuner, the inverter, and the power supply are mounted on the first circuit board,
    the signal processor is mounted on the second circuit board, and
    on the first circuit board, the tuner is arranged in a lower portion of a left or right side of the first circuit board, the inverter is arranged in an upper portion of an opposite side of the first circuit board to the tuner, the power supply is arranged in a lower portion in the opposite side of the first circuit board to the tuner, and the connector is arranged in an upper portion of the same side of the first circuit board as the tuner.

2. A liquid crystal television apparatus including a tuner for extracting an image signal having a predetermined frequency from signals received in an antenna, a signal processor for performing a digital processing for the image signal extracted by the tuner, a liquid crystal cell for displaying an image based on an output from the signal processor, a light source for backlight arranged on a back side of the liquid crystal cells for irradiating the cells, an inverter for driving the light source for backlight, and a power supply for supplying power to each portion, comprising:
    a first circuit board including a single-sided board; and
    a second circuit board including a multilayered board,
    wherein the first circuit board is electrically connected to the second circuit board,
    an area of the second circuit board is smaller than an area of the first circuit board,
    the tuner, the inverter and the power supply are mounted on the first circuit board,
    the signal processor is mounted on the second circuit board, and
    on the first circuit board, the tuner is arranged at a first corner on a left or right side of the first circuit board and the inverter is arranged at a second corner in a diagonal direction from the first corner.

3. The liquid crystal television apparatus according to claim 2, wherein the power supply includes an AC power circuit including a transformer, and the power is supplied from a secondary side of the transformer to each portion.

4. The liquid crystal television apparatus according to claim 1, wherein the tuner includes a vertical-arrangement typed tuner element used in a CRT television.

5. The liquid crystal television apparatus according to claim 2, wherein the tuner includes a vertical-arrangement typed tuner element used in a CRT television.

* * * * *